(12) United States Patent
Chen

(10) Patent No.: US 7,387,155 B2
(45) Date of Patent: Jun. 17, 2008

(54) COLORED AND TEXTURED HEAT DISSIPATING DEVICE

(76) Inventor: Shyh Ming Chen, 235 Chung - Ho Box 8-24, Taipei (TW)

( * ) Notice: Subject to any disclaimer, the term of this patent is extended or adjusted under 35 U.S.C. 154(b) by 27 days.

(21) Appl. No.: 11/272,943

(22) Filed: Nov. 15, 2005

(65) Prior Publication Data

US 2007/0107883 A1 May 17, 2007

(51) Int. Cl.
*H05K 7/20* (2006.01)
(52) U.S. Cl. .............. 165/11.1; 165/80.3; 165/104.33; 165/133; 361/704
(58) Field of Classification Search .............. 165/80.3, 165/133, 104.33, 11.1
See application file for complete search history.

(56) References Cited

U.S. PATENT DOCUMENTS

| | | | | |
|---|---|---|---|---|
| 2,965,819 | A * | 12/1960 | Rosenbaum | 257/722 |
| 4,106,686 | A * | 8/1978 | Valliant et al. | 226/188 |
| 4,232,068 | A * | 11/1980 | Hoh et al. | 428/43 |
| 4,884,331 | A * | 12/1989 | Hinshaw | 29/558 |
| 5,035,282 | A * | 7/1991 | Kawashita et al. | 165/133 |
| 5,038,858 | A * | 8/1991 | Jordan et al. | 165/185 |
| 5,490,559 | A * | 2/1996 | Dinulescu | 165/148 |
| 5,993,385 | A * | 11/1999 | Johnston et al. | 600/213 |
| 6,095,739 | A * | 8/2000 | Albertson et al. | 411/439 |
| 6,830,098 | B1 * | 12/2004 | Todd et al. | 165/104.33 |
| 6,870,735 | B2 * | 3/2005 | Genova et al. | 361/690 |
| 7,097,332 | B2 * | 8/2006 | Vamberi | 362/405 |
| 2003/0094275 | A1 * | 5/2003 | Mochizuki et al. | 165/185 |
| 2004/0035558 | A1 * | 2/2004 | Todd et al. | 165/104.26 |

FOREIGN PATENT DOCUMENTS

DE 29618792 U1 * 6/1997

* cited by examiner

*Primary Examiner*—Allen J Flanigan

(57) ABSTRACT

A colored heat dissipating device comprises at least one heat conductive tube; a plurality of fins combined with the heat dissipating device; each fin being formed with a colored protection film by anodizing processing. Furthermore, a colored heat dissipating device comprises at least one seat; a plurality of fins combined with the seat; each fin being formed with a colored protection film by anodizing processing. Moreover the protection films of all the fins have the same color, the fins are combined with the heat conductive tube by punching. Or the protection films of fins are divided into several sets, the sets have different colors, the fins are combined with the heat conductive tube by punching. Thus the heat dissipating devices is anti-oxidized, erode-proof and dirt-proof. Thereby the indication on the protection film can be used to indicate the specifications of electronic devices suitable to be used therewith.

4 Claims, 5 Drawing Sheets

COLORED AND TEXTURED HEAT DISSIPATING DEVICE

FIELD OF THE INVENTION

The present invention relates to heat dissipating devices, and in particular to a colored heat dissipating device, wherein anodizing processing is used to form protection films on the fins. The fins are combined with seats or heat conductive tubes so as to form a heat dissipating devices. Laser engraving is used to form patterns, textures, or characters on the protection films as indications. The protection films are colors. Thus the heat dissipating devices of the present invention is anti-oxidized, erode-proof and dirt-proof. Thereby the indication on the protection film can be used to indicate the specifications of electronic devices suitable to be used with the heat dissipating devices.

BACKGROUND OF THE INVENTION

Heat dissipating devices are widely used in electronic devices, such as CPUs, hard disks, readers, etc., for dissipating heat of the electronic devices. The current electronic elements have different specifications. Thereby the designs of the heat dissipating devices are also matched to specific electronic devices. Thus it is necessary to indicate the respective electronic devices matching to the heat dissipating devices. Thus, the uses can select a desired one.

In the prior art, the heat dissipating devices are formed by a plurality of heat dissipating fins which have high heat conductive coefficients and are combined to seats or heat conductive tubes. The heat dissipating devices are made with specific configurations so as to match the specific electronic devices. However different heat dissipating devices are mixed in transfer or storage, and thus it is difficult to identify the kinds of the heat dissipating devices. Furthermore, in the prior art, the surfaces of the heat dissipating devices are not well processed, and thus after being used for a long time, the surface of the metal will oxidize or dirt or erode to affect the heat dissipating effect. Specifically the copper made fins, these problems are series. Thereby the prior art heat dissipating devices have dull outlook.

SUMMARY OF THE INVENTION

Accordingly, the primary object of the present invention is to provide a colored heat dissipating device, wherein anodizing processing is used to form protection films on the fins. The fins are combined with seats or heat conductive tubes so as to form a heat dissipating devices. Laser engraving is used to form patterns, textures, or characters on the protection films as indications. The protection films are colors. Thus the heat dissipating devices of the present invention is anti-oxidized, erode-proof and dirt-proof. Thereby the indication on the protection film can be used to indicate the specifications of electronic devices suitable to be used with the heat dissipating devices.

To achieve above objects, the present invention provides a colored heat dissipating device which comprises at least one heat conductive tube; a plurality of fins combined with the heat dissipating device; each fin being formed with a colored protection film by anodizing processing.

The protection film is at a surface of the fin or at a periphery of the fin.

In the anodizing processing, by controlling the voltage and processing time so as to determine the color and thickness of the protection film in the fin.

The protection films of all the fins have the same color, the fins are combined with the heat conductive tube by punching.

The protection films of fins are divided into several sets, the sets have different colors, the fins are combined with the heat conductive tube by punching.

The protection films of all the fins have the same color, the fins are combined by a buckle element and then are assembled with the heat conductive tube by punching.

The protection films of fins are divided into several sets, the sets have different colors, and the fins are combined by a buckle element and then are assembled with the heat conductive tube by punching.

Laser engraving is used to engrave the protection films so form patterns, textures, and characters.

A colored heat dissipating device comprises at least one seat; a plurality of fins combined with the seat; each fin being formed with a colored protection film by anodizing processing.

The protection films of all the fins have the same color, the fins are combined with the seat by embedding into a plurality of trenches in the seat.

The protection films of fins are divided into several sets, the sets have different colors, the fins are combined with the seat by embedding into a plurality of trenches in the seat.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
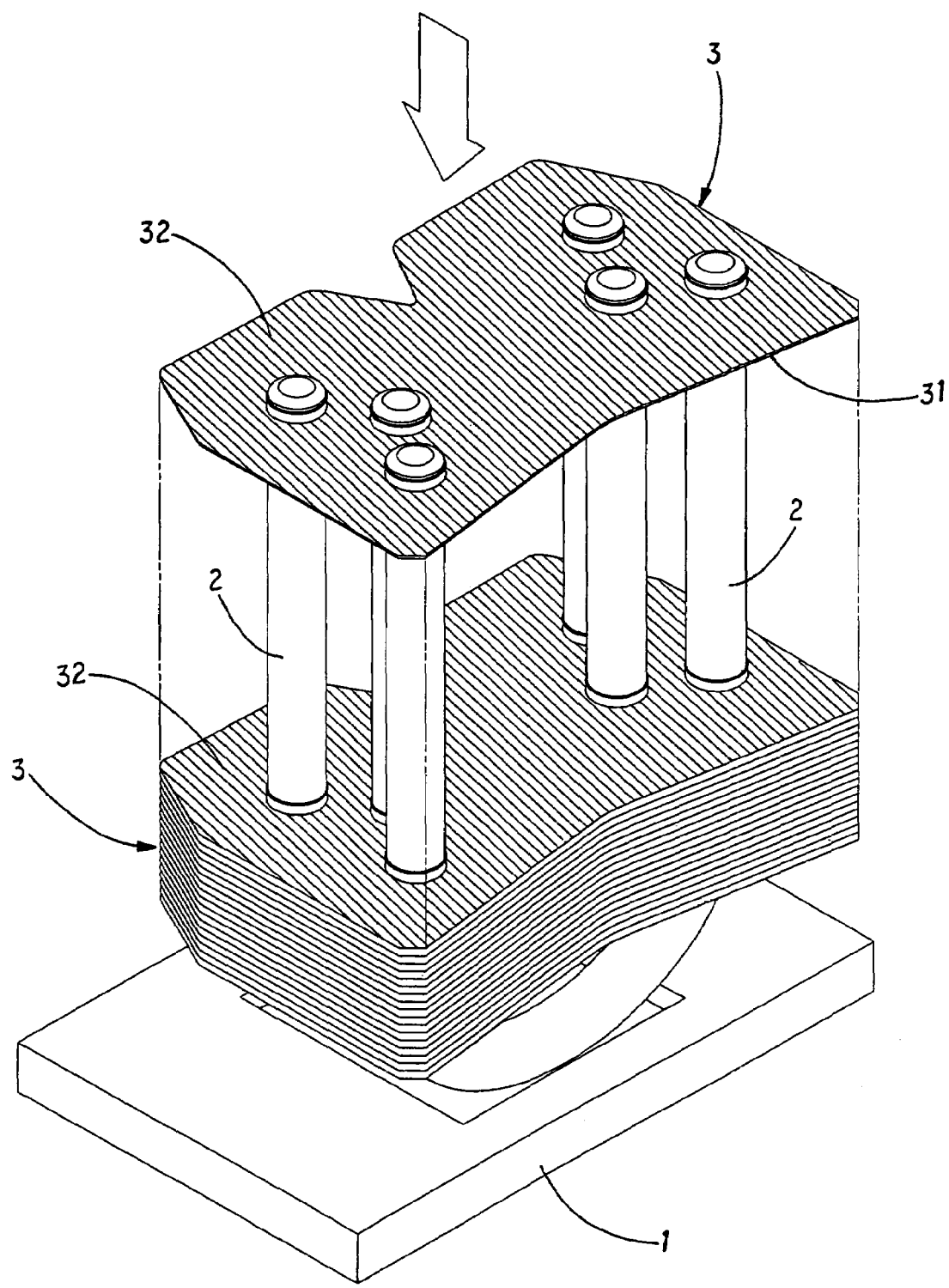
FIG. 1 is an exploded perspective view of the colored heat dissipating device of the present invention.
Figure 2:
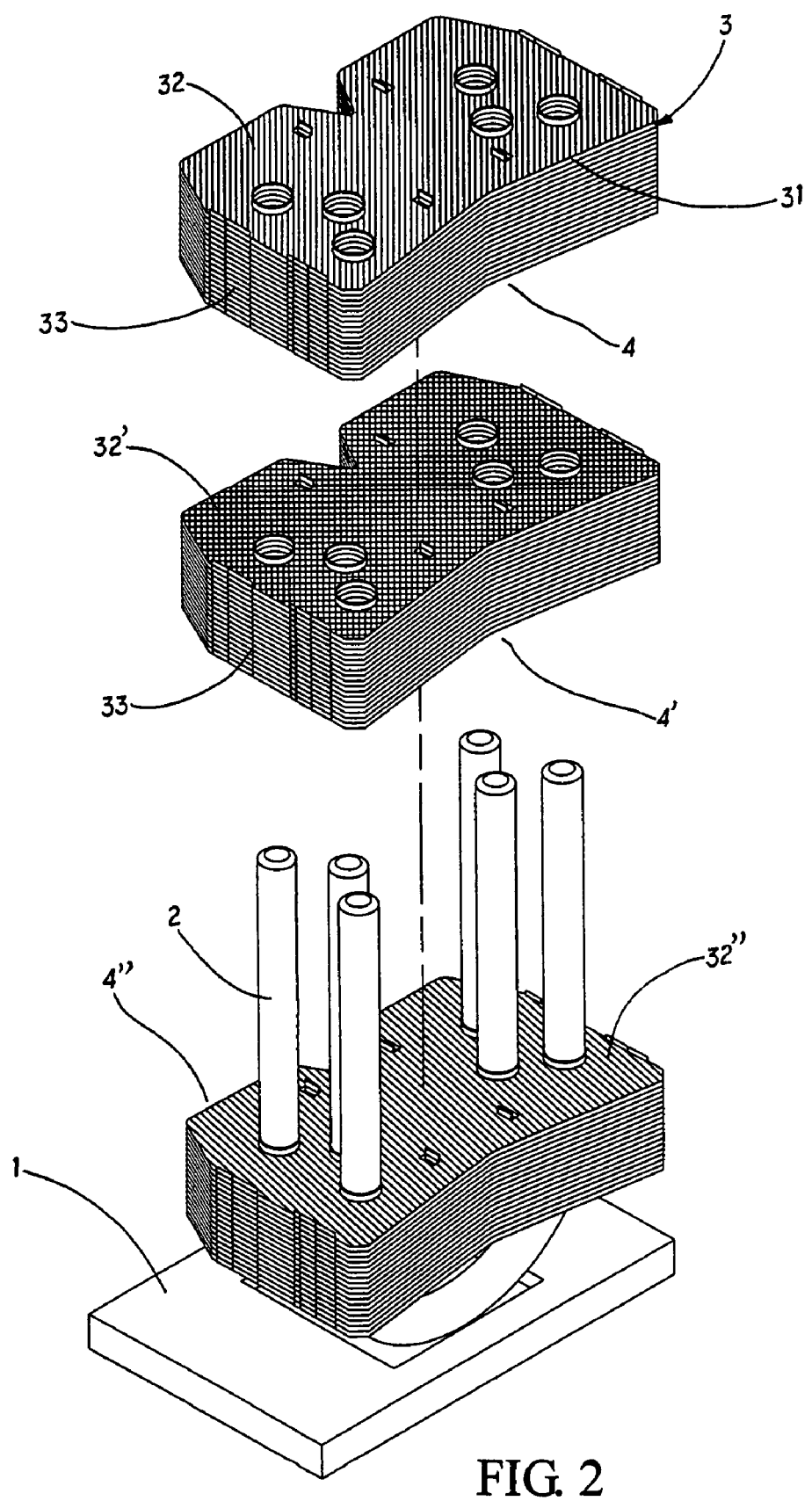
FIG. 2 is an exploded perspective view of another embodiment of the present invention.
Figure 3:
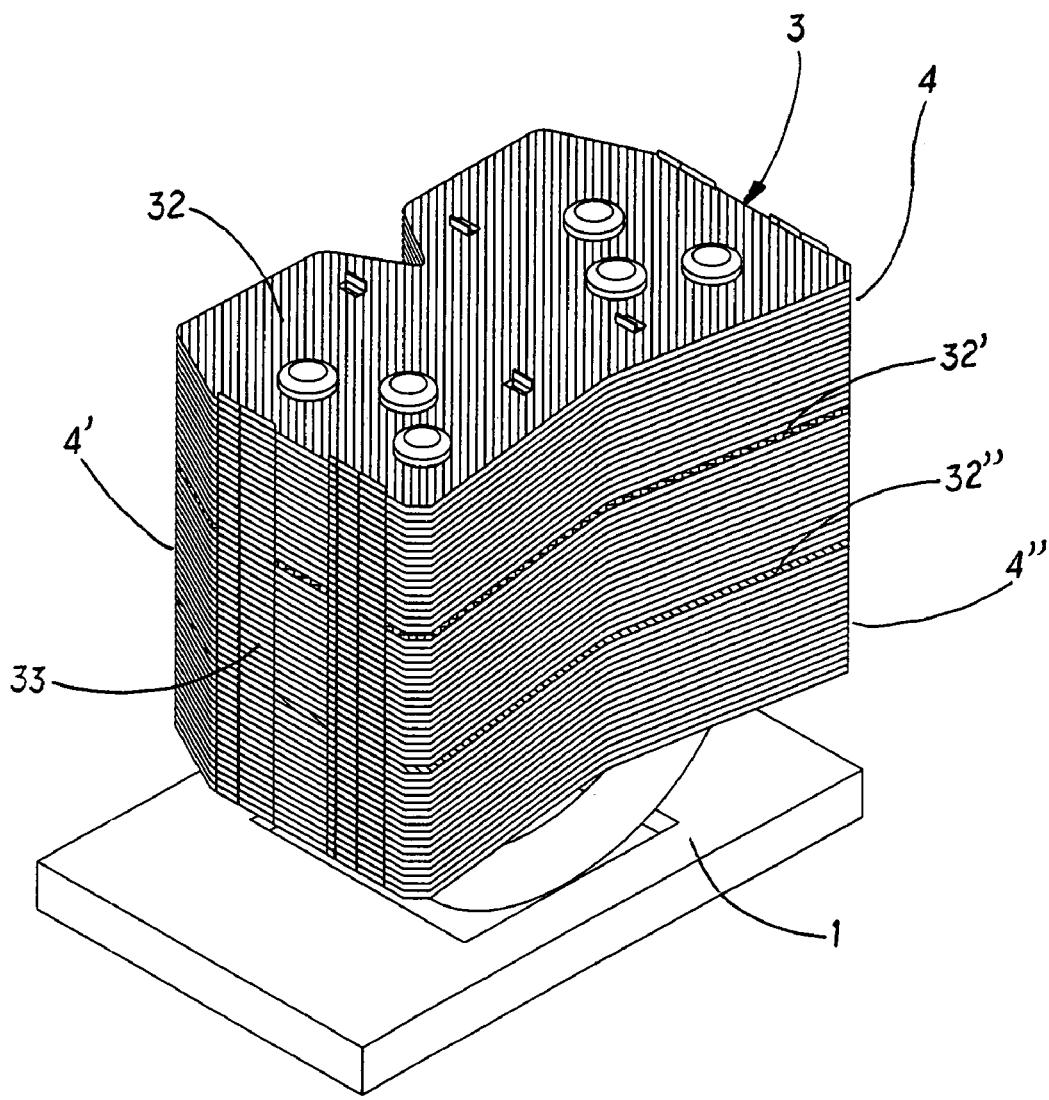
FIG. 3 is an assembled schematic view of the colored heat dissipating device of the present invention.

Referring to FIGS. 1, 2, and 3, the colored heat dissipating assembly of the present invention has the following elements.

A seat 1 is a metal seat with high heat conductive coefficient. An upper surface of the seat 1 is formed with a groove for receiving a heat conductive end 21 of the heat conductive tube 2. Another surface of the seat 1 has a configuration corresponding to an electronic device so that the heat dissipated from the electronic device can be transferred to the seat 1 effectively.

At least one heat conductive tube 2

A heat dissipating fin set 3 combined at an outer side of the heat conductive tube 2. The heat dissipating fin set 3 has a plurality of metal fins 31, such as aluminum alloy fins. By anodizing processing technology, the fins are placed within an electrolytic bath and anode electrode is connected to the fin. A surface of the metal fin 31 is oxidized so as to be formed with an oxide film as a protection film. By controlling voltages between the electrodes of the electrolytic bath, the protection films 32 can have various colors for protecting the metal fins 31 which are anti-oxidization, dirt-proof and erosion-preventing. Moreover surfaces of the metal fins 31 are flat and colored so as to have a beautiful outlook. The protection film 32 is a very thin oxidization film which is formed with a plurality of smaller and denser air holes without affecting the heat dissipating effect of the heat dissipating fin sets.

The protection film 32 formed by above-mentioned anodizing processing technology can be formed on the surface of the fin 31 or a periphery of the fin 31.

In above mentioned anodizing processing, laser engraving is used to form patterns or textures on the protection film 32 (such as characters of P4, AMS, etc.) so as to identify the specification of the heat dissipating device.

The fins 31 with protection films 32 can be assembled in punching so as to have a colored heat dissipating device.

Referring to FIGS. 2 and 3, a first plurality of fins 31 with protection films 32 of the same color and patterns can be assembled as a first sub-set 4 by a first buckle 33 at the lateral sides thereof. A second plurality of fins 31' with protection films 32' of the same color and patterns can be assembled as a second sub-set 4' by a first buckle 33 at the lateral sides thereof. A third plurality of fins 31" with protection films 32" of the same color and patterns can be assembled as a first sub-set 4" by a first buckle 33" at the lateral sides thereof. Then the sub-sets 4, 4' and 4" and a plurality of heat conductive tubes 2 are assembled as a heat dissipating device.

The fins can be processed by anodizing processing and laser engraving so as to have preferred effect. Thereby it is anti-oxidized, dust proof and erosion preventing.

Figure 4:
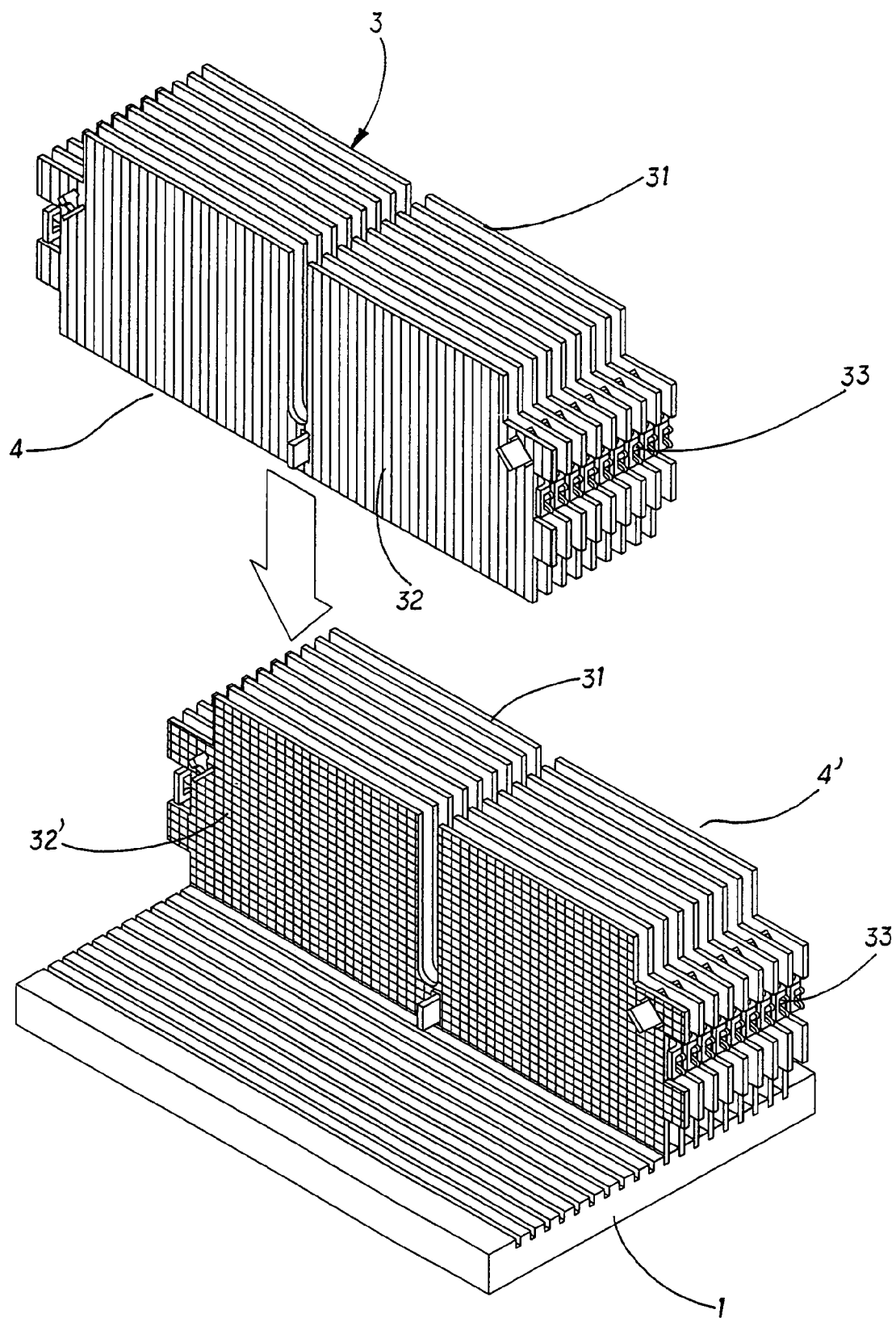
FIG. 4 is an exploded perspective view of another embodiment of the present invention.
Figure 5:
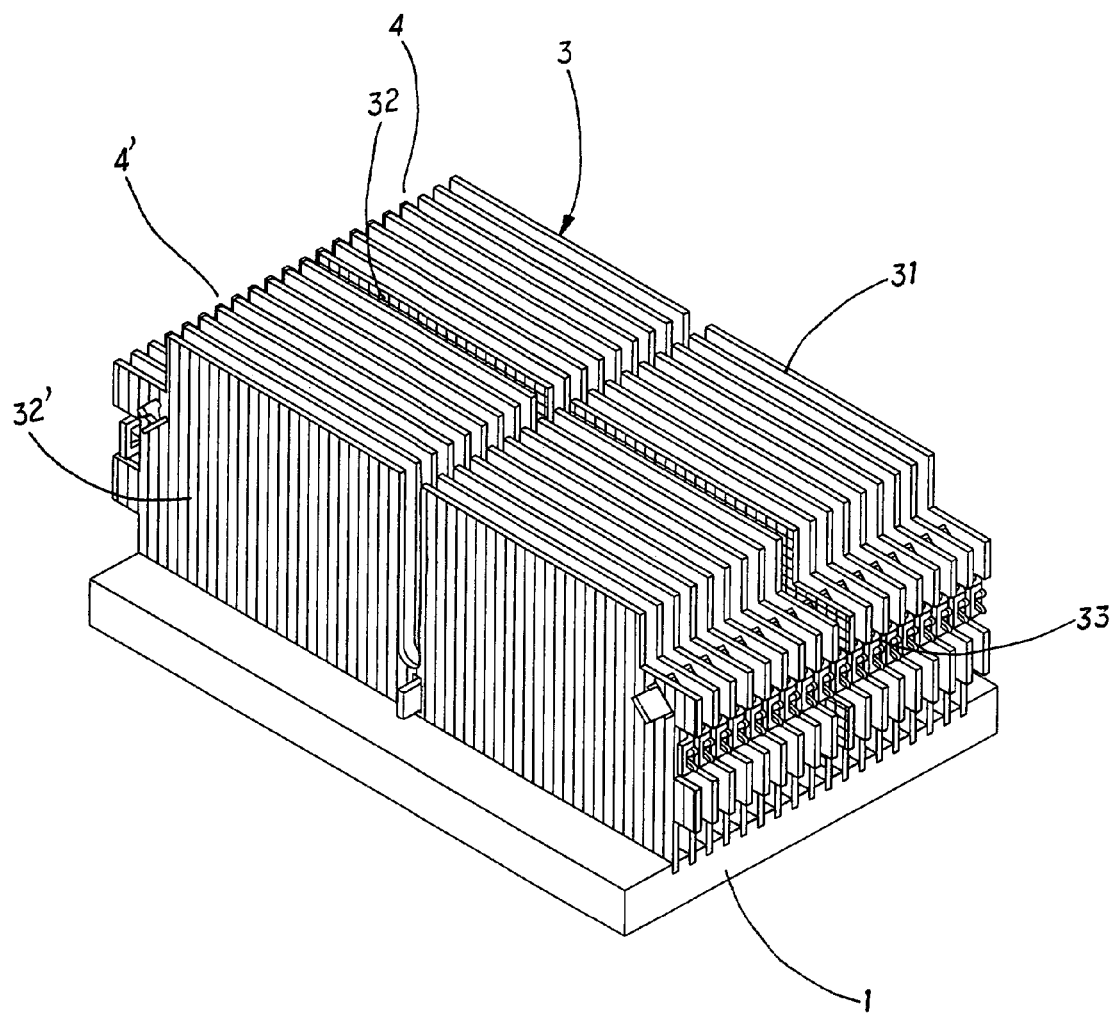
FIG. 5 is an exploded perspective view of a further embodiment of the present invention.

Referring to FIGS. 4 and 5, another embodiment of the present invention is illustrated. As shown in the drawings, the plurality of fins 31 with protection films 32, 32' are arranged longitudinally on a surface of a seat 1 by embedding into a plurality of trenches in the seat so as to form a heat dissipating device.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A colored heat dissipating device used for dissipating heat from an electronic device, comprising;
    a seat being a metal seat with high heat conductive coefficient; an upper surface of the seat being formed with a groove for receiving a heat conductive end of at least one heat conductive tube; another surface of the seat having a configuration corresponding to an electronic device so that the heat dissipated from the electronic device can be transferred to the seat effectively;
    the at least one heat conductive tube, the heat conductive tube being bent at a lower side and thus the bended section of the heat conductive tube is located at the groove of the seat;
    a heat dissipating fin set combined at an outer side of the heat conductive tube; the heat dissipating fin set having a plurality of metal fins, a surface of each metal fin being formed with an anodized processed oxide film as a protection film; due to controlling voltages between the electrodes of the electrolytic bath, the protection films have various colors for protecting the metal fins which are anti-oxidization, dirt-proof and erosion-preventing; surfaces of the metal fins being flat and colored so as to have a beautiful outlook; the protection film being a very thin oxidization film which has a plurality of smaller and denser air holes without affecting the heat dissipating effect of the heat dissipating fin sets;
    wherein the two ends of the heat conductive tube at two sides of the bended section of the heat conductive tube penetrate through the heat dissipating fin set; and
    wherein patterns or textures are formed on the protection film so as to identify the specification of the heat dissipating device; and
    wherein the fins are divided into several sets, the fins in the same set has a same color, and different sets have different colors, all the fin sets are combined together and then are assembled to the heat conductive tube.

2. The colored heat dissipating device used for dissipating heat from an electronic device as claimed in claim 1, wherein the fin is made of aluminum alloy.

3. The colored heat dissipating device used for dissipating heat from an electronic device as claimed in claim 1, wherein the protection film is formed on a surface of each fin.

4. The colored heat dissipating device used for dissipating heat from an electronic device as claimed in claim 1, wherein the protection film is formed on a periphery of each fin.

* * * * *